United States Patent
Kam et al.

(10) Patent No.: US 10,157,966 B2
(45) Date of Patent: Dec. 18, 2018

(54) ORGANIC LIGHT EMITTING DISPLAY DEVICE

(71) Applicant: LG Display Co., Ltd., Seoul (KR)

(72) Inventors: Youn-Seok Kam, Seoul (KR); Chang-Wook Han, Seoul (KR); Hong-Seok Choi, Seoul (KR); Sung-Hoon Pieh, Seoul (KR); Seok-Joon Oh, Paju-si (KR); Ki-Woog Song, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 167 days.

(21) Appl. No.: 15/195,556

(22) Filed: Jun. 28, 2016

(65) Prior Publication Data
US 2016/0307970 A1  Oct. 20, 2016

(30) Foreign Application Priority Data

Dec. 28, 2012 (KR) .......... 10-2012-0155899
Oct. 30, 2013 (KR) .......... 10-2013-0130280

(51) Int. Cl.
*H01L 27/32* (2006.01)
*H01L 51/50* (2006.01)
*H01L 51/00* (2006.01)

(52) U.S. Cl.
CPC ........ *H01L 27/3209* (2013.01); *H01L 27/322* (2013.01); *H01L 27/3213* (2013.01);
(Continued)

(58) Field of Classification Search
CPC ... H01L 51/50; H01L 51/5088; H01L 51/504; H01L 51/52; H01J 1/62; H01K 1/26
See application file for complete search history.

(56) References Cited

U.S. PATENT DOCUMENTS

2009/0091242 A1* 4/2009 Liao ............ H01L 51/006
                                                         313/504
2009/0191428 A1* 7/2009 Hatwar ........ H01L 51/0077
                                                         428/690

(Continued)

FOREIGN PATENT DOCUMENTS

CN   101882665       11/2010
CN   101960632 A     1/2011
(Continued)

OTHER PUBLICATIONS

First Office Action for Chinese Patent Application No. CN 201310727236.0, Oct. 9, 2015, 17 Pages.
(Continued)

*Primary Examiner* — Fernando L Toledo
*Assistant Examiner* — Lawrence-Linh T Nguyen
(74) *Attorney, Agent, or Firm* — Fenwick & West LLP

(57) ABSTRACT

An organic light emitting display device includes first and second electrodes facing each other on a substrate, a charge generation layer formed between the first and second electrodes, a first light emitting stack formed between the charge generation layer and the first electrode, and a second light emitting stack formed between the charge generation layer and the second electrode, wherein a hole injection layer of a light emitting stack to realize blue color of the first and second light emitting stacks is formed by doping a host formed of hexaazatriphenylene (HAT-CN) with 0.5% to less than 10% of a dopant formed of a hole transporting material based on a volume of the hole injection layer.

11 Claims, 12 Drawing Sheets

(52) U.S. Cl.
CPC ...... *H01L 51/5044* (2013.01); *H01L 51/5088* (2013.01); *H01L 51/002* (2013.01); *H01L 51/006* (2013.01); *H01L 51/0056* (2013.01); *H01L 51/0058* (2013.01); *H01L 51/0059* (2013.01); *H01L 51/0072* (2013.01); *H01L 2251/5376* (2013.01)

(56) References Cited

U.S. PATENT DOCUMENTS

| | | |
|---|---|---|
| 2009/0206736 A1 | 8/2009 | Kuma et al. |
| 2011/0187259 A1 | 8/2011 | Fukuda et al. |

FOREIGN PATENT DOCUMENTS

| | | |
|---|---|---|
| CN | 102396296 A | 3/2012 |
| EP | 2 416 628 A1 | 2/2012 |
| KR | 10-2013-0135180 A | 12/2013 |

OTHER PUBLICATIONS

UK Combined Search and Examination Report, UK Patent Application No. GB1322736.8, Jun. 23, 2014, 7 pages.
Office Action for U.S. Appl. No. 14/134,149, dated Oct. 7, 2015, 11 Pages.
Office Action for U.S. Appl. No. 14/134,149, dated Mar. 3, 2015, 9 Pages.

\* cited by examiner

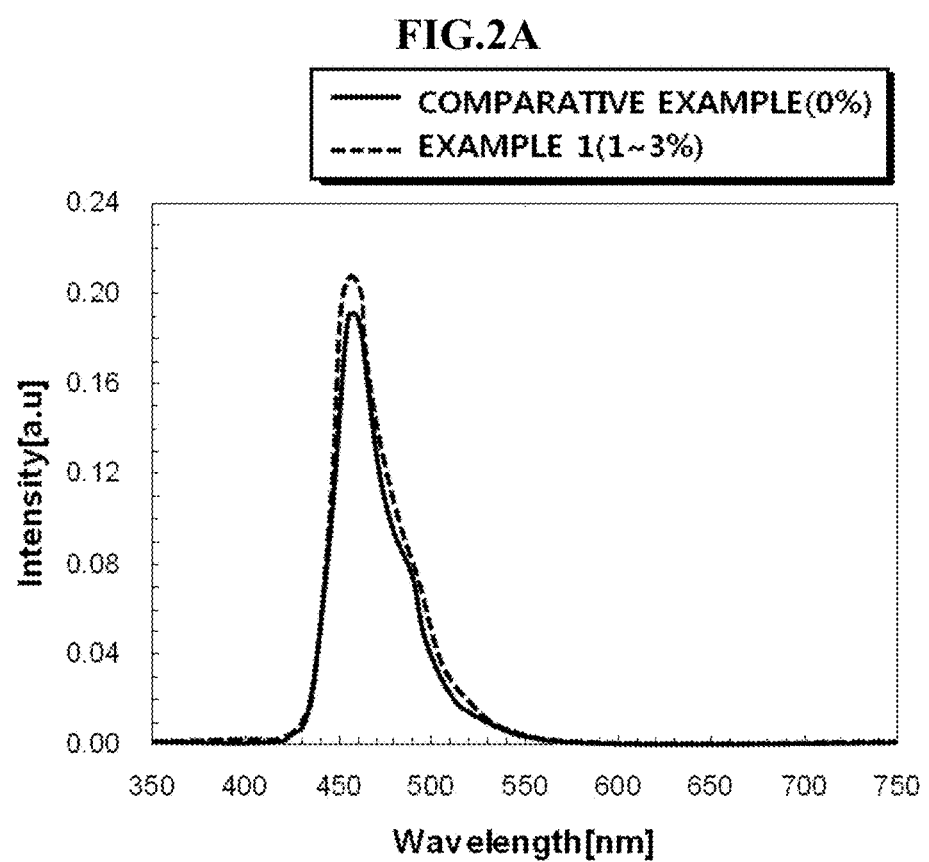

ORGANIC LIGHT EMITTING DISPLAY DEVICE

CROSS-REFERENCE TO RELATED APPLICATION

This application is a divisional application of U.S. patent application Ser. No. 14/134,149 filed on Dec. 19, 2013, which claims the benefit of Republic of Korea Patent Application No. 10-2012-0155899, filed on Dec. 28, 2012, and Republic of Korea Patent Application No. 10-2013-0130280, filed on Oct. 30, 2013, all of which are hereby incorporated by reference in their entirety.

BACKGROUND

1. Technical Field

The present disclosure relates to an organic light emitting display device with enhanced efficiency.

2. Discussion of the Related Art

In line with recent information era, the display field, which visually displays electrical information signals, has rapidly developed. To meet such development, various flat panel display devices with excellent performance, such as ultra-thin, lightweight, and low power consumption, have developed.

Examples of flat panel display devices include, without being limited to, a liquid crystal display (LCD) device, a plasma display panel (PDP) device, a field emission display (FED) device, and an organic light emitting device (OLED).

In particular, OLEDs, which are self-emissive devices, have faster response time, higher luminous efficiency, higher luminance and wider viewing angles than other flat panel display devices.

A conventional organic light emitting display device includes a blue emission layer formed of a fluorescent blue material to produce white light. In a fluorescent blue device including the blue emission layer formed of a fluorescent blue material, however, a roll-off phenomenon in which luminous efficiency according to luminance decreases as luminance increases occurs.

SUMMARY

Accordingly, the present disclosure is directed to an organic light emitting display device that substantially obviates one or more problems due to limitations and disadvantages of the related art.

An object of the present disclosure is to provide an organic light emitting display device with enhanced efficiency.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, an organic light emitting display device includes first and second electrodes facing each other on a substrate, a charge generation layer formed between the first and second electrodes, a first light emitting stack formed between the charge generation layer and the first electrode, and a second light emitting stack formed between the charge generation layer and the second electrode, wherein a hole injection layer of a light emitting stack to realize blue color of the first and second light emitting stacks is formed by doping a host formed of hexaazatriphenylene (HAT-CN) with 0.5% to less than 10% of a dopant formed of a hole transporting material based on a volume of the hole injection layer.

The dopant may be formed of the same material as that of a hole transport layer of any one of the first and second light emitting stacks.

The first light emitting stack may include a fluorescent blue emission layer, and the second light emitting stack may include a phosphorescent yellow-green emission layer.

The organic light emitting display device may further include at least one third light emitting stack formed between the second light emitting stack and the second electrode.

The dopant may be formed of the same material as that of a hole transport layer of at least one of the first, second and third light emitting stacks.

The first and third light emitting stacks may include a fluorescent blue emission layer, and the second light emitting stack may include a phosphorescent yellow-green emission layer.

In another aspect of the present disclosure, an organic light emitting display device includes first and second electrodes facing each other on a substrate, a blue emission layer formed between the first and second electrodes, a hole injection layer and a hole transport layer, formed between the blue emission layer and the first electrode, and an electron transport layer formed between the blue emission layer and the second electrode, wherein the hole injection layer is formed by doping a host formed of hexaazatriphenylene (HAT-CN) with 0.5% to less than 10% of a dopant formed of a hole transporting material based on a volume of the hole injection layer.

The dopant may be formed of the same material as that of the hole transport layer.

The dopant may be formed of a material having higher hole mobility than electron mobility and a hole mobility of $5.0 \times 10^{-5}$ Vs/cm$^2$ to $1.0 \times 10^{-2}$ Vs/cm$^2$.

A doping rate of the dopant may be 1% to 5% based on the volume of the hole injection layer.

It is to be understood that both the foregoing general description and the following detailed description of the present disclosure are exemplary and explanatory and are intended to provide further explanation as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure. In the drawings:

FIGS. 2A to 2C are graphs for explaining optical characteristics of an organic light emitting display device of Comparative Example and the blue organic light emitting display device according to the first embodiment of the present disclosure;

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts.

Figure 1:
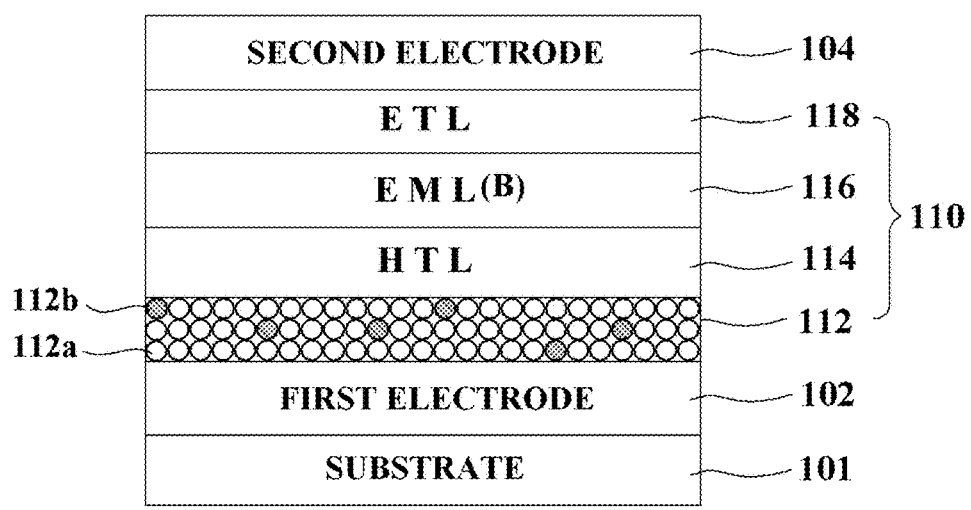
FIG. 1 is a sectional view of a blue organic light emitting device according to a first embodiment of the present disclosure.

FIG. 1 is a sectional view of a blue organic light emitting device according to a first embodiment of the present disclosure.

The blue organic light emitting device of FIG. 1 includes first and second electrodes 102 and 104 and an organic emission layer 110 formed between the first and second electrodes 102 and 104.

Any one of the first and second electrodes 102 and 104 is formed as a transparent electrode or a semi-transparent electrode and the other thereof is formed as a reflective electrode. When the first electrode 102 is a semi-transparent electrode and the second electrode 104 is a reflective electrode, the organic light emitting display device is embodied as a bottom emission type that emits light in a bottom direction. When the second electrode 104 is a semi-transparent electrode and the first electrode 102 is a reflective electrode, the organic light emitting display device is embodied as a top emission type that emits light in a top direction. In the present disclosure, a case in which the first electrode 102 as an anode is formed as a reflective electrode and the second electrode 104 as a cathode is formed as a semi-transparent electrode will be described by way of example.

The first electrode 102 is formed as multiple layers including a metal layer formed of aluminum (Al) or an Al alloy (e.g., AlNd) and a transparent layer formed of indium tin oxide (ITO), indium zinc oxide (IZO), or the like and serves as a reflective electrode.

The second electrode 104 is formed as a single layer or multiple layers, and each layer constituting the second electrode 104 is formed of a metal, an inorganic material, a mixture of metals, a mixture of a metal and an inorganic material, or a mixture thereof. When each layer is formed of the mixture of a metal and an inorganic material, a mix ratio thereof is 10:1 to 1:10 and, when each layer is formed of the mixture of metals, a mix ratio thereof is 10:1 to 1:10. The metal constituting the second electrode 104 may be Ag, Mg, Yb, Li, or Ca, the inorganic material constituting the second electrode 104 may be $Li_2O$, CaO, LiF, or $MgF_2$, and the metal and the inorganic material facilitate migration of electrons and thus enable a large amount of electrons to be supplied to the organic emission layer 110.

A hole injection layer (HIL) 112, a hole transport layer (HTL) 114, an emission layer (EML(B)) 116, and an electron transport layer (ETL) 118 are sequentially formed between the first and second electrodes 102 and 104.

The HIL 112 facilitates injection of holes from the first electrode 102. The HTL 114 supplies the holes from the HIL 112 to the EML(B) 116. The ETL 118 supplies electrons from the second electrode 104 to the EML(B) 116.

The holes supplied via the HTL 114 and the electrons supplied via the ETL 118 are recombined in the EML(B) 116, whereby light is emitted. In particular, the EML(B) 116 is formed of a fluorescent blue material and thus realizes blue color.

The HIL 112 of the organic light emitting display device according to the first embodiment of the present disclosure is formed by doping a host 112a with 0.5% to less than 10% of a dopant 112b based on a volume of the HIL 112 and has a thickness of about 7 nm or less. In this regard, the dopant 112b may be doped on the host 112a with a doping rate of 1 to 5% based on the volume of the HIL 112. The host 112a is formed of hexaazatriphenylene (HAT-CN), and the dopant 112b is formed of a hole transporting material having higher hole mobility than electron mobility. In this regard, the hole transporting material may be a material having a hole mobility of $5.0 \times 10^{-5}$ Vs/$cm^2$ to $1.0 \times 10^{-2}$ Vs/$cm^2$. For example, the hole transporting material may be at least one of N,N-dinaphthyl-N,N'-diphenyl benzidine (NPD), N,N'-bis-(3-methylphenyl)-N,N'-bis-(phenyl)-benzidine (TPD), s-TAD, and 4,4',4"-Tris(N-3-methylphenyl-N-phenylamino)-triphenylamine (MTDATA), and a material for forming the HTL 114 may be used as the hole transporting material. Accordingly, the hole mobility of the HIL 112 is enhanced and thus hole injection characteristics at an interface between the HIL 112 and the HTL 114 are enhanced. As a result, a formation rate of excitons formed through combination between electrons and holes increases due to stable charge balance in the EML(B) 116 and, accordingly, luminous efficiency is enhanced.

Figure 2B:
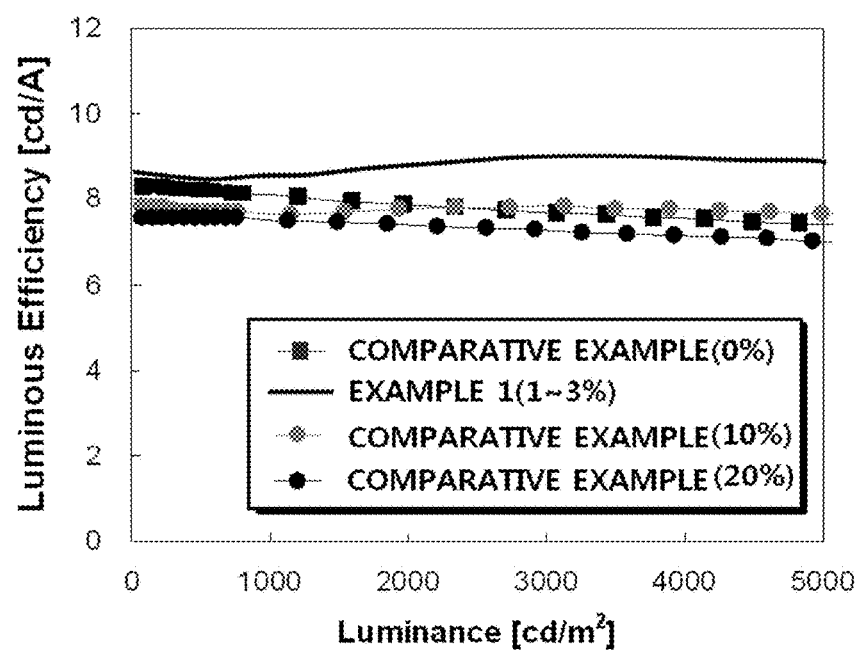
Figure 2C:
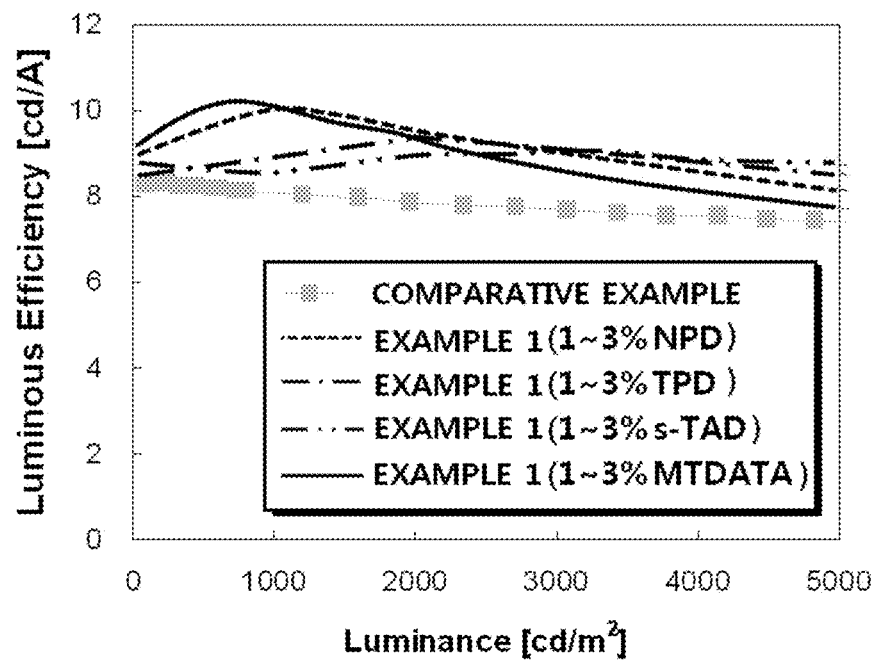

FIGS. 2A to 2C are graphs for explaining optical characteristics of organic light emitting display devices of Comparative Example and Example 1.

In particular, as illustrated in FIG. 2A, the organic light emitting display device of Example 1 including the HIL 112 doped with 1 to 3% of the dopant 112b has higher peak intensity than that of the organic light emitting display device of Comparative Example including an HIL that is undoped with a dopant and thus, as shown in Table 1 below, the organic light emitting display device of Example 1 has higher efficiency at 10 mA/$cm^2$, increased by 7% or greater, than that of the organic light emitting display device of Comparative Example.

TABLE 1

| | 10 mA/$cm^2$ | | | | |
|---|---|---|---|---|---|
| | Efficiency (Cd/A) | QE (%) | Color coordinate (CIEx) | Color coordinate (CIEy) | Roll off |
| Comparative Example | 8.0 | 9.6 | 0.136 | 0.092 | 0.93 |
| Example 1 | 8.6 | 10.3 | 0.137 | 0.092 | 1.05 |

In addition, as illustrated in FIG. 2B, a blue light emitting device including the HIL 112 doped with 1 to 3% of the dopant 112b has increased luminous efficiency in the entire luminance region when compared to blue light emitting devices of Comparative Examples respectively including an undoped HIL, an HIL doped with 10% of a dopant, and an HIL doped with 20% of a dopant. In addition, as shown in Table 1, the organic light emitting display device of Example 1 has a roll-off factor (a ratio of efficiency at a current density of 50 mA/cm$^2$ to efficiency at a current density of 10 mA/cm$^2$) of 1.05, which is higher than that of the organic light emitting display device of Comparative Example having a roll-off factor of 0.93. From the results, it can be confirmed that the blue organic light emitting device according to the first embodiment of the present disclosure undergoes reduced roll-off phenomenon in which efficiency is decreased in a high luminance region.

In particular, it can be confirmed that the blue light emitting device including the HIL 112 doped with 1 to 3% of the dopant 112b undergoes less roll-off phenomenon in which efficiency is decreased in a high luminance region than the blue light emitting devices respectively including the HIL doped with 10% of a dopant and the HIL doped with 20% of a dopant. Thus, in the blue light emitting device according to the first embodiment of the present disclosure, a doping rate of the dopant 112b of the HIL 112 may be 0.5% to less than 10% based on the volume of the HIL 112.

In addition, as illustrated in FIG. 2C, it can be confirmed that, even though different types of materials (e.g., NPD, TPD, s-TAD, and MTDATA) for forming the dopant 112b are used, the blue light emitting device of Example including the HIL 112 doped with 1 to 3% of the dopant 112b has enhanced luminous efficiency in the entire luminance region when compared to the blue light emitting device of Comparative Example. Although NPD, TPD, s-TAD, and MTDATA have been described as dopant materials by way of example, various other hole transporting materials may be used as dopant materials and the same effect may be obtained using the dopant materials.

Figure 3:
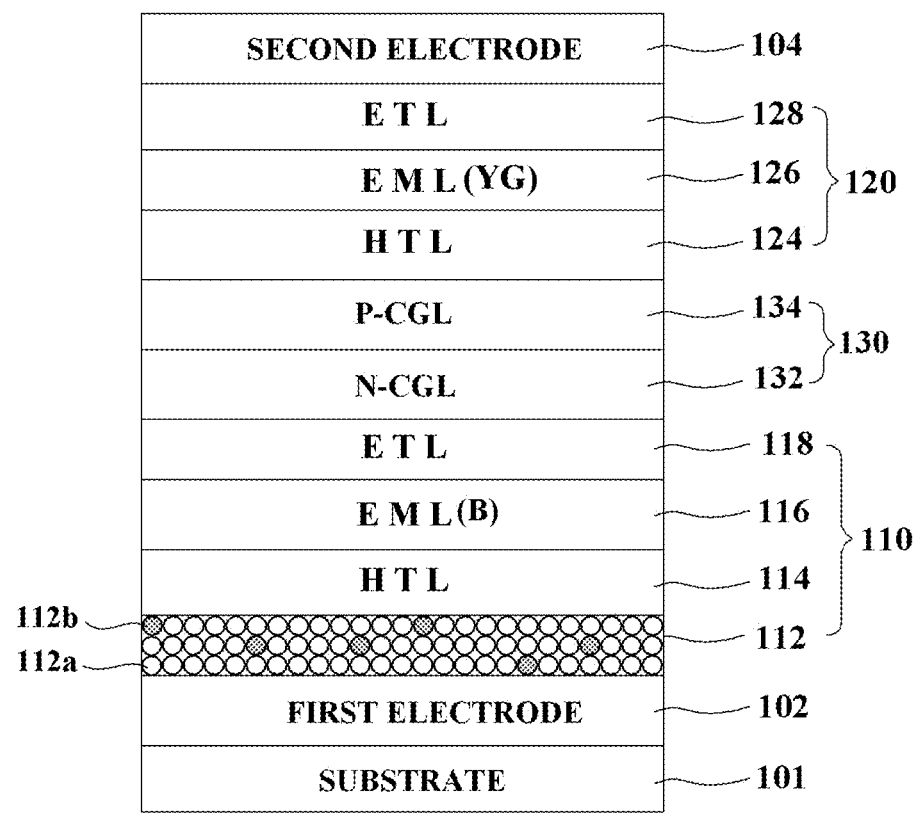
FIG. 3 is a sectional view of an organic light emitting display device according to a second embodiment of the present disclosure.

FIG. 3 is a sectional view of an organic light emitting display device according to a second embodiment of the present disclosure.

The organic light emitting display device of FIG. 3 includes the same elements as those of the organic light emitting display device of FIG. 1, except that the organic light emitting display device of FIG. 3 has a two-stack structure. Thus, a detailed description of the same elements will be omitted herein.

The organic light emitting display device of FIG. 3 includes the first and second electrodes 102 and 104 facing each other, first and second light emitting stacks 110 and 120 formed between the first and second electrodes 102 and 104, and a charge generation layer (CGL) 130 disposed between the first and second light emitting stacks 110 and 120. In the present embodiment, two light emitting stacks are used, but embodiments are not limited thereto. That is, at least three light emitting stacks may be formed.

The first light emitting stack 110 is formed between the first electrode 102 and the charge generation layer 130. The first light emitting stack 110 includes the HIL 112, a first HTL 114, a first EML(B) 116, and a first ETL 118 that are sequentially formed on the first electrode 102.

The second light emitting stack 120 is formed between the second electrode 104 and the charge generation layer 130. The second light emitting stack 120 includes a second HTL 124, a second EML(YG) 126, and a second ETL 128 that are sequentially formed on the charge generation layer 130.

The first EML(B) 116 includes a fluorescent blue dopant and host to emit blue light, and the second EML(YG) 126 includes a phosphorescent yellow-green dopant and host to emit orange light. Accordingly, the blue light of the first EML(B) 116 and the orange light of the second EML(YG) 126 may be realized as white light through mixing. In addition, white light may be emitted using other fluorescent dopants and phosphorescent dopants.

The charge generation layer 130 is formed between the first and second light emitting stacks 110 and 120 and controls charge balance between the first and second light emitting stacks 110 and 120. The charge generation layer 130 includes an N-type charge generation layer 132 and a P-type charge generation layer 134 that are sequentially stacked.

The N-type charge generation layer 132 injects electrons into the first light emitting stack 110, and the P-type charge generation layer 134 injects holes into the second light emitting stack 120.

The electrons transferred to the first light emitting stack 110 via the N-type charge generation layer 132 and holes transferred via the HIL 112 and the first HTL 114 are combined in the first EML(B) 116 of the first light emitting stack 110, forming excitons and releasing energy, whereby visible light is emitted.

The holes transferred to the second light emitting stack 120 via the P-type charge generation layer 134 and electrons transferred via the second electrode 104 and the second ETL 128 are combined in the second EML(YG) 126 of the second light emitting stack 120, forming excitons and releasing energy, whereby visible light is emitted.

In the organic light emitting display device according to the second embodiment of the present disclosure, the HIL 112 of the first light emitting stack 110 to emit blue light is formed by doping the host 112a with 0.5% to less than 10% of the dopant 112b based on a volume of the HIL 112 and has a thickness of about 7 nm or less. In this regard, the dopant 112b may be doped on the host 112a with a doping rate of 1 to 5% based on the volume of the HIL 112. The host 112a is formed of hexaazatriphenylene (HAT-CN), and the dopant 112b is formed of a hole transporting material having higher hole mobility than electron mobility. In this regard, the hole transporting material may be a material having a hole mobility of $5.0 \times 10^{-5}$ Vs/cm$^2$ to $1.0 \times 10^{-2}$ Vs/cm$^2$. For example, the hole transporting material may be at least one of NPD, TPD, s-TAD, and MTDATA, and materials for forming the first and second HTLs 114 and 124 of the first and second light emitting stacks 110 and 120 may be used as the hole transporting material. Accordingly, the hole mobility of the HIL 112 of the first light emitting stack 110 is enhanced and thus hole injection characteristics at an interface between the HIL 112 and the first HTL 114 of the first light emitting stack 110 are enhanced. As a result, a formation rate of excitons formed through combination between electrons and holes increases due to charge balance in the first EML(B) 116 and, accordingly, luminous efficiency is enhanced.

Figure 4A:
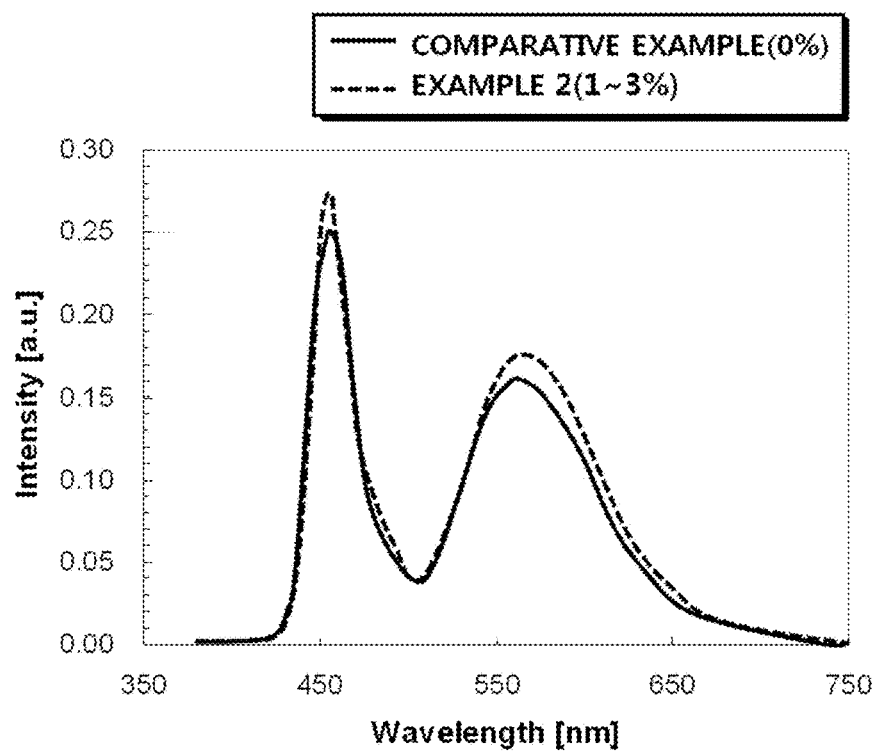
FIGS. 4A to 4C are graphs for explaining all-optical characteristics of an organic light emitting display device of Comparative Example and the organic light emitting display device according to the second embodiment of the present disclosure.
Figure 4B:
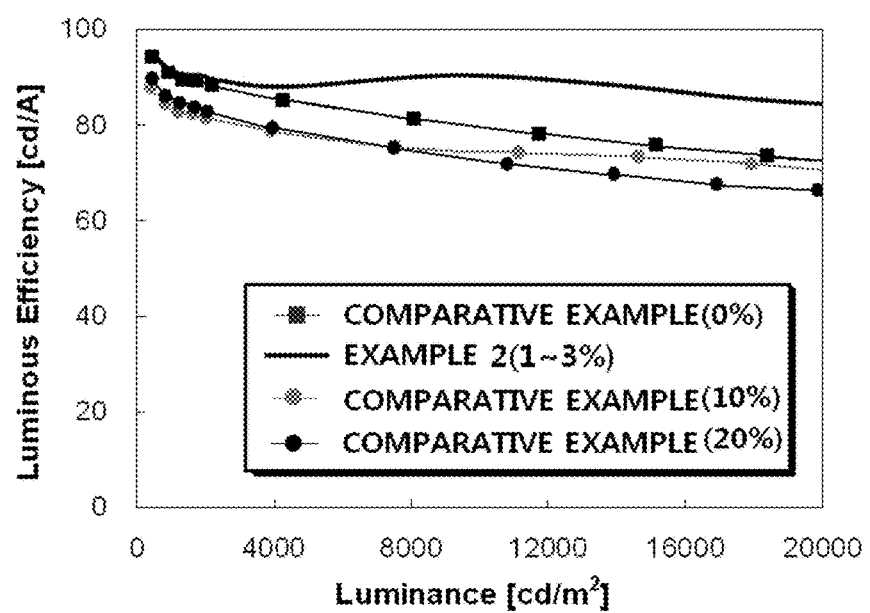
Figure 4C:
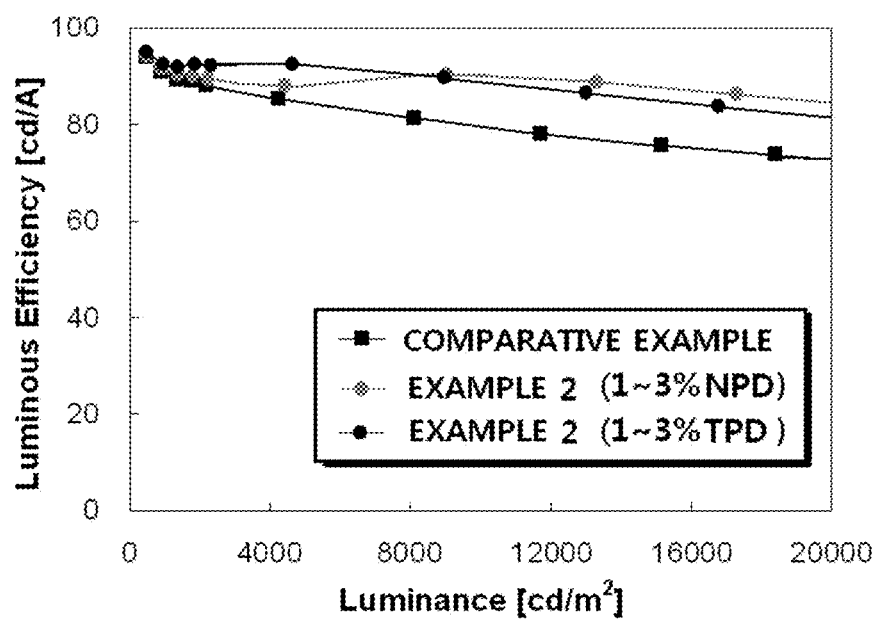

FIGS. 4A to 4C are graphs for explaining all-optical characteristics of organic light emitting display devices of Comparative Example and Example 2.

In particular, as illustrated in FIG. 4A, the organic light emitting display device of Example 2 including the HIL 112 of the first light emitting stack 110, doped with 1 to 3% of the dopant 112b, has higher peak intensity (blue peak) of the first EML(B) 116 to realize blue color and higher peak intensity (YG peak) of the second EML(YG) 126 to realize orange color than those of the organic light emitting display device of Comparative Example including an HIL of a first light emitting stack, undoped with a dopant and thus, as shown in Table 2 below, the organic light emitting display device of Example 2 has higher efficiency at 10 mA/cm$^2$, increased by 6% or greater, than that of the organic light emitting display device of Comparative Example.

TABLE 2

|  | 10 mA/cm² | | | | |
|---|---|---|---|---|---|
|  | Efficiency (Cd/A) | QE (%) | Color coordinate (CIEx) | Color coordinate (CIEy) | Roll off |
| Comparative Example | 81.1 | 32.0 | 0.317 | 0.339 | 0.81 |
| Example 2 | 86.5 | 35.1 | 0.324 | 0.330 | 0.84 |

In addition, as illustrated in FIG. 4B, the organic light emitting display device of Example 2 including the HIL 112 of the first light emitting stack 110, doped with 1% to 3% of the dopant 112b, has higher luminous efficiency in the entire luminance region than that of organic light emitting display devices of Comparative Examples respectively including an HIL of a first light emitting stack, undoped with a dopant, an HIL of a first light emitting stack, doped with 10% of a dopant, and an HIL of a first light emitting stack, doped with 20% of a dopant. In addition, as shown in Table 2, the organic light emitting display device of Example 2 has a roll-off factor (a ratio of efficiency at a current density of 50 mA/cm² to efficiency at a current density of 10 mA/cm²) of 0.84, which is higher than that of the organic light emitting display device of Comparative Example having a roll-off factor of 0.81. From the results, it can be confirmed that the organic light emitting display device having a multi-stack light emitting structure according to the second embodiment of the present disclosure undergoes reduced roll-off phenomenon in which efficiency is decreased in a high luminance region.

In particular, it can be confirmed that the organic light emitting display device of Example 2 including the HIL 112 of the first light emitting stack 110, doped with 1% to 3% of the dopant 112b, undergoes less roll-off phenomenon in which efficiency is decreased in a high luminance region than the organic light emitting devices respectively including the HIL doped with 10% of a dopant and the HIL doped with 20% of a dopant. Thus, in the organic light emitting display device according to the second embodiment of the present disclosure, a doping rate of the dopant 112b of the HIL 112 of the first light emitting stack 110 may be 0.5% to less than 10%.

In addition, as illustrated in FIG. 4C, it can be confirmed that, even though different types of materials (e.g., NPD and TPD) for forming the dopant 112b are used, the organic light emitting display device of Example 2 including the HIL 112 doped with 1% to 3% of the dopant 112b has enhanced luminous efficiency in the entire luminance region when compared to the organic light emitting display device of Comparative Example. Although NPD and TPD have been described as dopant materials by way of example, various other hole transporting materials may be used as dopant materials and the same effect may be obtained using the dopant materials.

In the second embodiment of the present disclosure, two light emitting stacks are used, but embodiments are not limited thereto. That is, at least three light emitting stacks may be formed. For example, as illustrated in FIG. 5, three light emitting stacks, e.g., first, second and third light emitting stacks 110, 120 and 140, may be formed.

Figure 5:
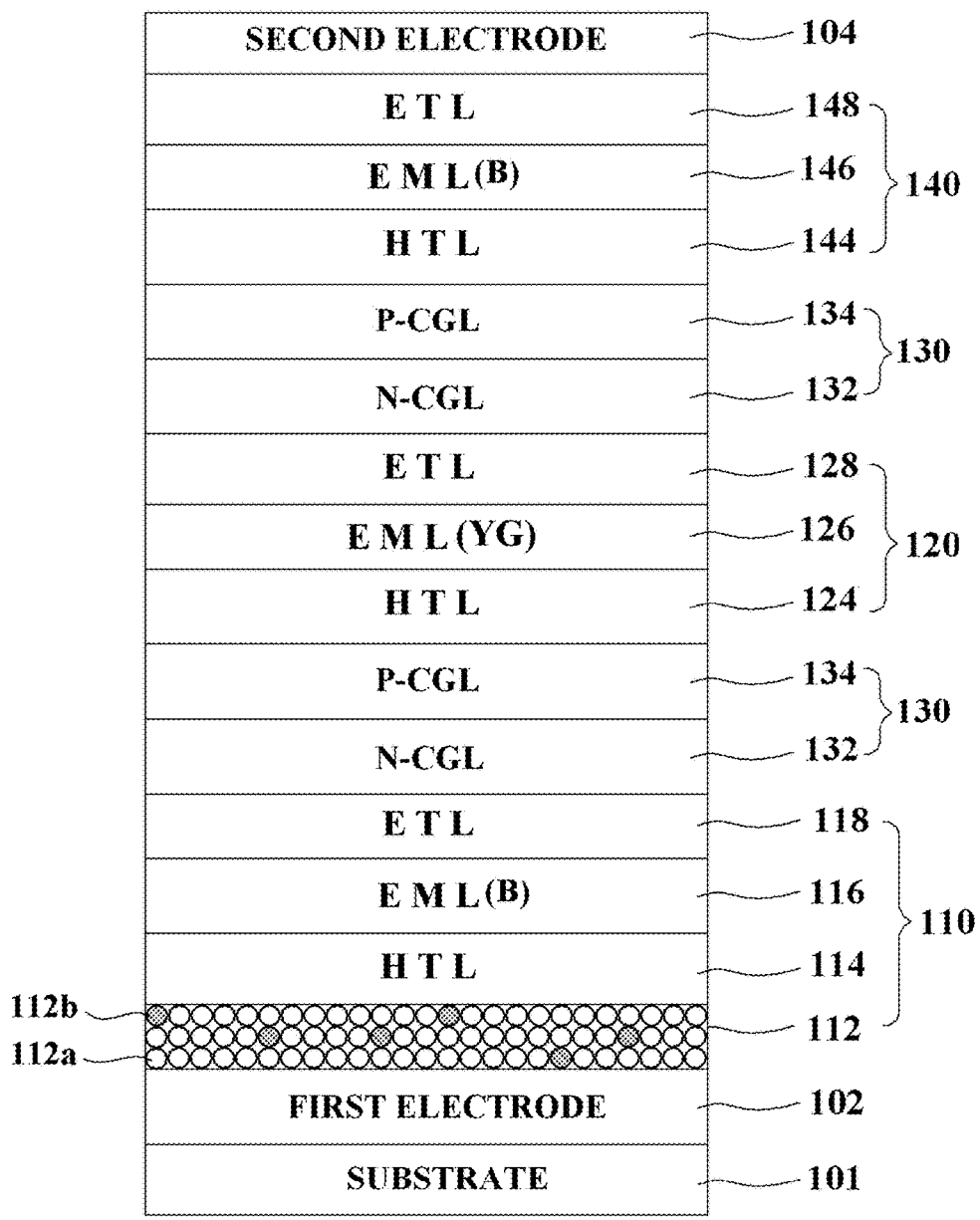
FIG. 5 is a sectional view of an organic light emitting display device according to a third embodiment of the present disclosure including three light emitting stacks.

An organic light emitting display device illustrated in FIG. 5 includes the first and second electrodes 102 and 104 facing each other, the first, second and third light emitting stacks 110, 120 and 140 formed between the first and second electrodes 102 and 104, and charge generation layers 130 respectively disposed between the first and second light emitting stacks 110 and 120 and between the second and third light emitting stacks 120 and 140.

The first light emitting stack 110 is formed between the first electrode 102 and the charge generation layer 130. The first light emitting stack 110 includes the HIL 112, the first HTL 114, the first EML(B) 116, and the first ETL 118 that are sequentially formed on the first electrode 102.

The second light emitting stack 120 is formed between the first and third light emitting stacks 110 and 140. The second light emitting stack 120 includes the second HTL 124, the second EML(YG) 126, and the second ETL 128 that are sequentially formed on the charge generation layer 130.

The third light emitting stack 120 is formed between the second electrode 104 and the charge generation layer 130. The third light emitting stack 120 includes a third HTL 144, a third EML(B) 146, and a third ETL 148 that are sequentially formed on the charge generation layer 130.

The first and third EMLs(B) 116 and 146 include a fluorescent blue dopant and host to emit blue light, and the second EML(YG) 126 includes a phosphorescent yellow-green dopant and host to emit orange light. Accordingly, the blue light of the first and third EMLs(B) 116 and 146 and the orange light of the second EML(YG) 126 may be realized as white light through mixing. In particular, a structure of the organic light emitting display device according to a third embodiment of the present disclosure differs from that of the organic light emitting display device of FIG. 3 in that the organic light emitting display device according to the third embodiment further includes the third EML(B) 146 to realize blue color. In addition, white light may be realized using other fluorescent dopants and phosphorescent dopants.

The charge generation layers 130 are respectively formed between the first and second light emitting stacks 110 and 120 and between the second and third light emitting stacks 120 and 140 and control charge balance among the first, second and third light emitting stacks 110, 120 and 140. Each charge generation layer 130 includes an N-type charge generation layer 132 and a P-type charge generation layer 134 that are sequentially stacked.

The N-type charge generation layer 132 injects electrons into the first and second light emitting stacks 110 and 120, and the P-type charge generation layer 134 injects holes into the second and third light emitting stacks 120 and 140.

The electrons transferred to the first light emitting stack 110 via the N-type charge generation layer 132 and holes transferred via the HIL 112 and the first HTL 114 are combined in the first EML(B) 116 of the first light emitting stack 110, forming excitons and releasing energy, whereby visible light is emitted.

The electrons transferred to the second light emitting stack 120 via the N-type charge generation layer 132 and holes transferred to the second light emitting stack 120 via the P-type charge generation layer 134 are combined in the second EML(YG) 126 of the second light emitting stack 120, forming excitons and releasing energy, whereby visible light is emitted.

The holes transferred to the third light emitting stack 140 via the P-type charge generation layer 134 and electrons transferred via the second electrode 104 and the third ETL 148 are combined in the third EML(B) 146 of the third light emitting stack 140, forming excitons and releasing energy, whereby visible light is emitted.

In the organic light emitting display device according to the third embodiment of the present disclosure, the HIL 112 of the first light emitting stack 110 to emit blue light is formed by doping the host 112a with the dopant 112b with a doping rate of 0.5% to less than 10% based on a volume of the HIL 112 and has a thickness of about 7 nm or less. In this regard, the dopant 112b may be doped on the host 112a in a doping rate of 1% to 5% based on the volume of the HIL 112. The host 112a is formed of HAT-CN, and the dopant 112b is formed of a hole transporting material having higher hole mobility than electron mobility. In this regard, the hole transporting material may be a material having a hole mobility of $5.0 \times 10^{-5}$ Vs/cm$^2$ to $1.0 \times 10^{-2}$ Vs/cm$^2$. For example, the hole transporting material may be at least one of NPD, TPD, s-TAD, and MTDATA, and a material for forming at least one of the first, second and third HTLs 114, 124 and 144 of the first, second and third light emitting stacks 110, 120 and 140 may be used as the hole transporting material. Accordingly, the hole mobility of the HIL 112 of the first light emitting stack 110, including a hole transporting material, is enhanced and thus hole injection characteristics at an interface between the HIL 112 and the first HTL 114 of the first light emitting stack 110 are enhanced. As a result, a formation rate of excitons formed through combination between electrons and holes increases due to charge balance in the first EML(B) 116 and, accordingly, luminous efficiency is enhanced.

Figure 6A:
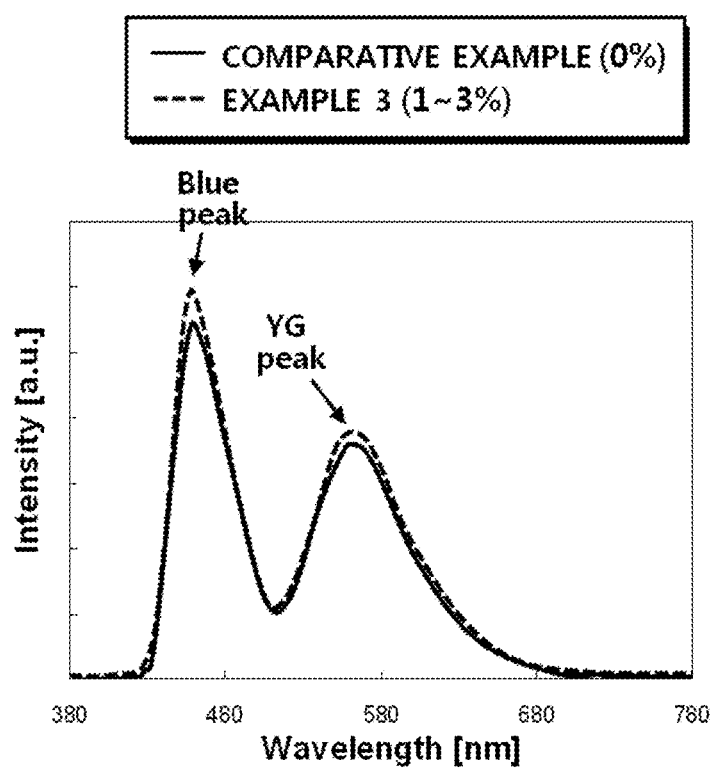
FIGS. 6A and 6B are graphs for explaining all-optical characteristics of an organic light emitting display device of Comparative Example and the organic light emitting display device according to the third embodiment of the present disclosure.
Figure 6B:
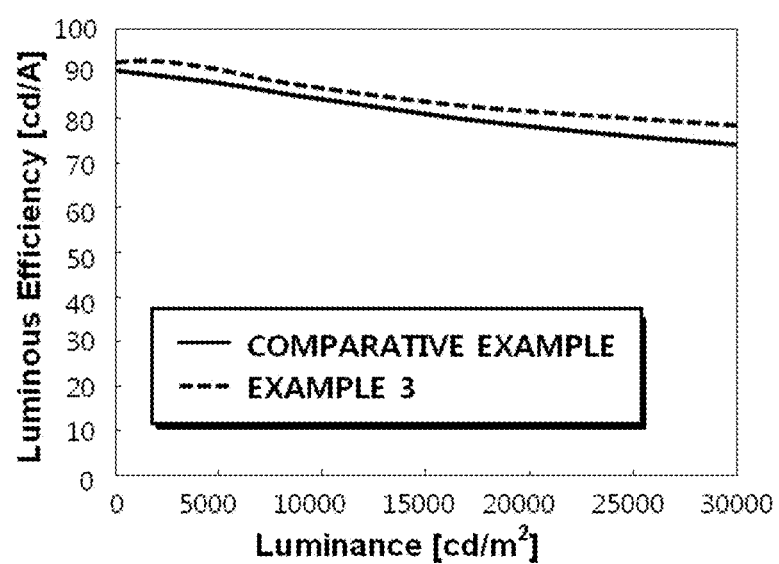

FIGS. 6A and 6B are graphs for explaining all-optical characteristics of organic light emitting display devices of Comparative Example and Example 3.

In particular, as illustrated in FIG. 6A, the organic light emitting display device of Example 3 including the HIL 112 of the first light emitting stack 110, doped with the dopant 112b, has higher peak intensity (blue peak) of the first EML(B) 116 to realize blue color and higher peak intensity (YG peak) of the second EML(YG) 126 to realize orange color than those of the organic light emitting display device of Comparative Example including an HIL of a first light emitting stack, undoped with a dopant and thus, as shown in Table 3 below, the organic light emitting display device of Example 3 has higher efficiency at 10 mA/cm$^2$, increased by 2.9% or greater, than that of the organic light emitting display device of Comparative Example.

TABLE 3

|  | 10 mA/cm$^2$ | |
| --- | --- | --- |
|  | Efficiency (Cd/A) | Roll off |
| Comparative Example | 84.9 | 0.85 |
| Example 3 | 87.8 | 0.87 |

In addition, as illustrated in FIG. 6B, the organic light emitting display device of Example 3 including the HIL 112 of the first light emitting stack 110, doped with 1 to 3% of the dopant 112b, has higher luminous efficiency in the entire luminance region than that of the organic light emitting display device of Comparative Example including an HIL of a first light emitting stack, undoped with a dopant. In addition, the organic light emitting display device of Example 3 has a roll-off factor (a ratio of efficiency at a current density of 50 mA/cm$^2$ to efficiency at a current density of 10 mA/cm$^2$) of 0.87, which is higher than that of the organic light emitting display device of Comparative Example having a roll-off factor of 0.85. From the results, it can be confirmed that the organic light emitting display device having a multi-stack light emitting structure according to the third embodiment of the present disclosure undergoes reduced roll-off phenomenon in which efficiency is decreased in a high luminance region.

Figure 7:
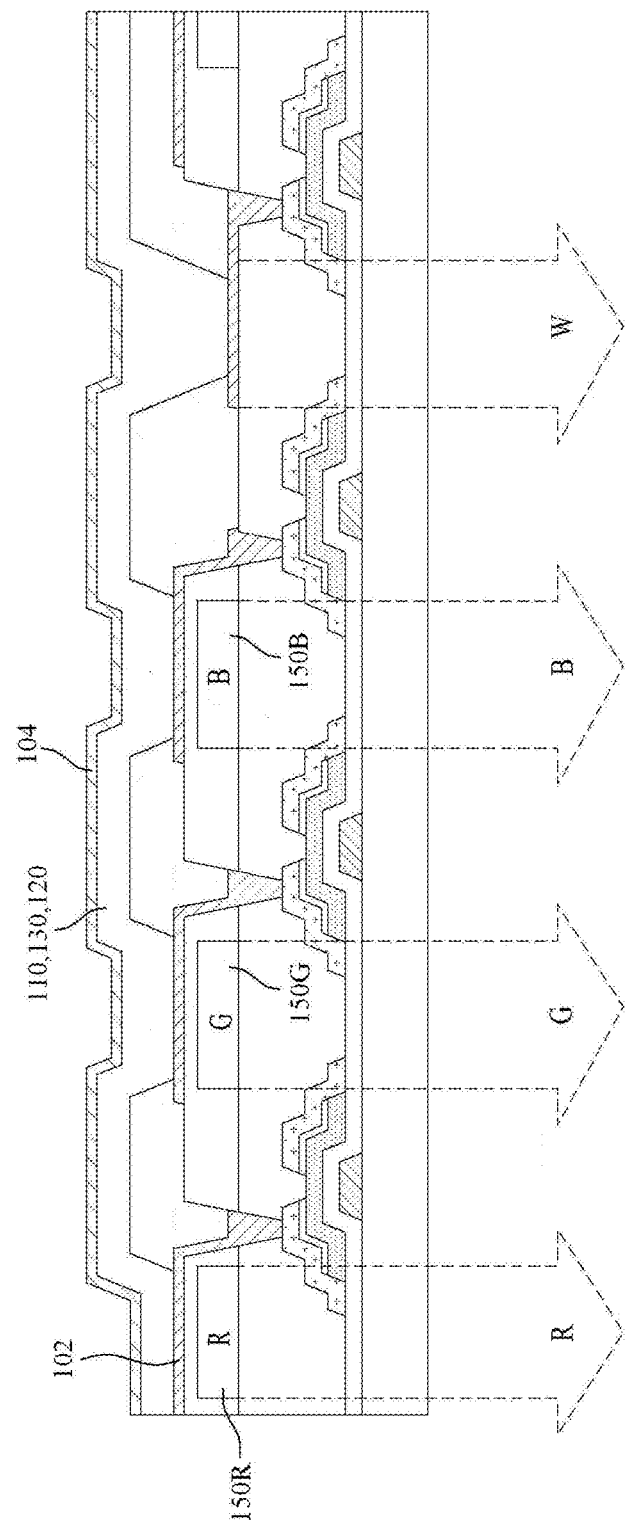
FIG. 7 is a sectional view of an organic light emitting display device according to the present disclosure including color filters.

The organic light emitting display devices according to the present disclosure may be applied to a structure having red, green and blue color filters 150R, 150G and 150B as illustrated in FIG. 7. White light generated via the first and second light emitting stacks 110 and 120 illustrated in FIG. 3 or white light generated via the first, second and third light emitting stacks 110, 120 and 140 illustrated in FIG. 5 is emitted as red light while passing through a sub-pixel region provided with the red color filter 150R, is emitted as green light while passing through a sub-pixel region provided with the green color filter 150G, is emitted as blue light while passing through a sub-pixel region provided with the blue color filter 150B, and is emitted unchanged while passing through a sub-pixel region not provided with a color filter.

As is apparent from the foregoing description, in organic light emitting display devices according to the present disclosure, a hole injection layer is formed by doping a host formed of HAT-CN with a hole transporting material. Accordingly, hole mobility of the hole injection layer is enhanced and thus hole injection characteristics at an interface between the hole injection layer and a hole transport layer are enhanced. As a result, a formation rate of excitons formed through combination between electrons and holes increases due to stable charge balance in an emission layer and thus luminous efficiency may be enhanced and a roll-off phenomenon may also be reduced. In particular, when the organic light emitting display devices according to the present disclosure are applied to a large area display panel, power consumption may be reduced.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device comprising:
   a first electrode and a second electrode facing each other on a substrate;
   a charge generation layer formed between the first electrode and the second electrode;
   a first light emitting stack formed between the charge generation layer and the first electrode; and
   a second light emitting stack formed between the charge generation layer and the second electrode,
   wherein one of the first and second light emitting stacks emits a blue light, and
   wherein a hole injection layer of one of the first and second light emitting stacks emitting blue light is formed by doping a host formed of hexaazatriphenylene (HAT-CN) with 0.5 vol. % to less than 10 vol. % of a dopant that is a hole transporting material based on a volume of the hole injection layer.

2. The organic light emitting display device according to claim 1, wherein the dopant is the same material as that of a hole transport layer of any one of the first light emitting stack and the second light emitting stack.

3. The organic light emitting display device according to claim 1, wherein the dopant is a material having a hole mobility higher than an electron mobility, the hole mobility from $5.0 \times 10^{-5}$ Vs/cm$^2$ to $1.0 \times 10^{-2}$ Vs/cm$^2$.

4. The organic light emitting display device according to claim 1, wherein a doping rate of the dopant is 1 vol. % to 5 vol. % based on the volume of the hole injection layer.

5. The organic light emitting display device according to claim 1, wherein the first light emitting stack comprises a fluorescent blue emission layer, and the second light emitting stack comprises a phosphorescent yellow-green emission layer.

6. The organic light emitting display device according to claim 1, further comprising at least one third light emitting stack formed between the second light emitting stack and the second electrode.

7. The organic light emitting display device according to claim 6, wherein the dopant is a same material as that of a hole transport layer of at least one of the first light emitting stack, the second light emitting stack, and the third light emitting stack.

8. The organic light emitting display device according to claim 6, wherein the dopant is a material having a hole mobility higher than an electron mobility, the hole mobility from $5.0 \times 10^{-5}$ Vs/cm$^2$ to $1.0 \times 10^{-2}$ Vs/cm$^2$.

9. The organic light emitting display device according to claim 6, wherein a doping rate of the dopant is 1 vol. % to 5 vol. % based on the volume of the hole injection layer.

10. The organic light emitting display device according to claim 6, wherein the first light emitting stack and the third light emitting stack comprise a fluorescent blue emission layer, and the second light emitting stack comprises a phosphorescent yellow-green emission layer.

11. An organic light emitting display device comprising:
a first electrode and a second electrode facing each other on a substrate;
a first light emitting stack comprising:
   a blue emission layer between the first electrode and the second electrode;
   a hole injection layer and a hole transport layer, between the blue emission layer and the first electrode; and
   an electron transport layer between the blue emission layer and the second electrode;
a second light emitting stack including a phosphorescent yellow-green emission layer between the first light emitting stack and the second electrode; and
a charge generation layer between the first and second light emitting stacks;
a third light emitting stack including a fluorescent blue emission layer between the second light emitting stack and the second electrode; and
a second charge generation layer between the second and third light emitting stacks,
wherein the hole injection layer is composed by doping a host composed of hexaazatriphenylene (HAT-CN) with 1 vol. % to less than 3 vol. % of a dopant that is a hole transporting material based on a volume of the hole injection layer,
wherein the dopant is composed of at least one of N,N-dinaphthyl-N,N'-diphenyl benzidine (NPD), N,N'-bis-(3-methylphenyl)-N,N'-bis-(phenyl)-benzidine (TPD), and s-TAD.

* * * * *